(12) United States Patent
Zhang et al.

(10) Patent No.: US 9,625,948 B2
(45) Date of Patent: Apr. 18, 2017

(54) ELECTRONIC DEVICES WITH RETRACTABLE DISPLAYS

(71) Applicant: Apple Inc., Cupertino, CA (US)

(72) Inventors: Zhen Zhang, San Jose, CA (US); Paul S. Drzaic, Morgan Hill, CA (US)

(73) Assignee: Apple Inc., Cupertino, CA (US)

(*) Notice: Subject to any disclaimer, the term of this patent is extended or adjusted under 35 U.S.C. 154(b) by 0 days.

(21) Appl. No.: 14/833,999

(22) Filed: Aug. 24, 2015

(65) Prior Publication Data
US 2017/0060183 A1 Mar. 2, 2017

(51) Int. Cl.
G06F 1/16 (2006.01)
H01L 51/00 (2006.01)

(52) U.S. Cl.
CPC .......... G06F 1/1652 (2013.01); G06F 1/1605 (2013.01); G06F 1/1615 (2013.01); G06F 1/1628 (2013.01); H01L 51/0097 (2013.01)

(58) Field of Classification Search
CPC .... G06F 1/1601; G06F 1/1605; G06F 1/1615; G06F 1/1616; G06F 1/1628; G06F 1/163; G06F 1/1652
USPC ................ 361/679.01–679.3, 679.55–679.59
See application file for complete search history.

(56) References Cited

U.S. PATENT DOCUMENTS

| 7,559,163 | B2 | 7/2009 | Ofuji et al. | |
| 8,169,697 | B2* | 5/2012 | Katsuma | G03B 21/58 359/443 |
| 8,289,232 | B2* | 10/2012 | Kobayashi | G09F 9/33 345/204 |
| 9,098,241 | B1 | 8/2015 | Cho et al. | |
| 9,189,028 | B2 | 11/2015 | Nakhimov | |
| 2001/0003450 | A1* | 6/2001 | Hemia | G06F 1/1615 345/170 |
| 2003/0160892 | A1* | 8/2003 | Tamura | H04N 5/2251 348/333.07 |
| 2004/0093778 | A1 | 5/2004 | Asvadi | |
| 2005/0041012 | A1* | 2/2005 | Daniel | G06F 1/1601 345/156 |

(Continued)

FOREIGN PATENT DOCUMENTS

| IL | WO 2009144722 A1 * | 12/2009 | ....... G02F 1/133308 |
| WO | 2015100396 | 7/2015 | |

OTHER PUBLICATIONS

The Future Looks Flexible, Scientific American, Feb. 2014.

*Primary Examiner* — Nidhi Thaker
(74) *Attorney, Agent, or Firm* — Treyz Law Group, P.C.; G. Victor Treyz; Kendall W. Abbasi

(57) ABSTRACT

An electronic device may have a pair of elongated housings. A flexible display may be placed in a first position in which the display is retracted within one of the housings and a second position in which the flexible display is deployed and extends between the housings in a planar shape for viewing by a user. Support structures such as rigid slats that run parallel to the housings and bistable slats that run perpendicular to the rigid slats may be used to support the flexible display. Speakers, microphones, cameras, and other components can be mounted in the housings. The housings may be held together using magnets and may contain electrical components such as integrated circuits, batteries, and other devices. The components may be mounted on printed circuit boards that rotate within a rotating roller around which the display is wrapped when retracted.

28 Claims, 16 Drawing Sheets

(56) References Cited

U.S. PATENT DOCUMENTS

| | | | |
|---|---|---|---|
| 2008/0049003 A1* | 2/2008 | Hasegawa | G06F 1/1615 345/206 |
| 2008/0144265 A1* | 6/2008 | Aoki | G06F 1/1601 361/679.04 |
| 2008/0212271 A1* | 9/2008 | Misawa | G02F 1/133305 361/679.01 |
| 2010/0182738 A1* | 7/2010 | Visser | G06F 1/1613 361/679.01 |
| 2013/0044215 A1 | 2/2013 | Rothkopf et al. | |
| 2013/0169515 A1* | 7/2013 | Prushinskiy | G06F 1/1652 345/55 |
| 2014/0362512 A1* | 12/2014 | Hinson | G06F 15/025 361/679.21 |
| 2015/0122403 A1* | 5/2015 | Lee | G02F 1/133603 156/152 |
| 2015/0188092 A1* | 7/2015 | Park | H01L 51/52 257/40 |
| 2016/0070304 A1* | 3/2016 | Shin | H04M 1/0268 361/679.26 |
| 2016/0091923 A1* | 3/2016 | Morrison | G06F 1/1616 345/55 |

* cited by examiner

ELECTRONIC DEVICES WITH RETRACTABLE DISPLAYS

BACKGROUND

This relates generally to electronic devices, and, more particularly, to electronic devices with displays.

Electronic devices often include displays for presenting image to a user. Displays are typically formed from rigid planar substrates. The use of rigid display substrates can cause displays and electronic devices to be more bulky than desired. Although devices can be reduced in size by using smaller displays, this may result in viewing areas that are not as large as desired.

It would therefore be desirable to be able to provide improved electronic devices with displays.

SUMMARY

An electronic device may have a pair of elongated housings. A flexible display may be coupled between the housings. The flexible display may be placed in a first state in which the display is retracted within one of the housings and second state in which the flexible display is deployed and extends between the housings for viewing by a user.

The flexible housing may wrap around a rotatable roller in one of the elongated housings. A spring may rotate the roller when it is desired to retract the display. The device may contain electrical components such as integrated circuits, and other devices. The components may be mounted on printed circuit boards that rotate within the rotating roller.

Support structures such as horizontal and vertical slats may be attached to the rear of the display. The slats may include rigid slats that run parallel to the elongated housings and may include bistable slats that run perpendicular to the rigid slats. The bistable slats may have a rigid bowed state that helps maintain the display in a rigid state when deployed and may have a flexible flat state that allows the display to flex and wrap around the roller when retracted.

The flexible display may be provided with a light blocking and heat spreading layer, a grooved flexible substrate, a touch sensor, and other structures. Speakers, microphones, cameras, and other components can be mounted in the housings. The housings and support slats may be held together using magnets when the display is retracted. Dust brushes may be provided to remove dust from the flexible display.

DETAILED DESCRIPTION

Figure 1:
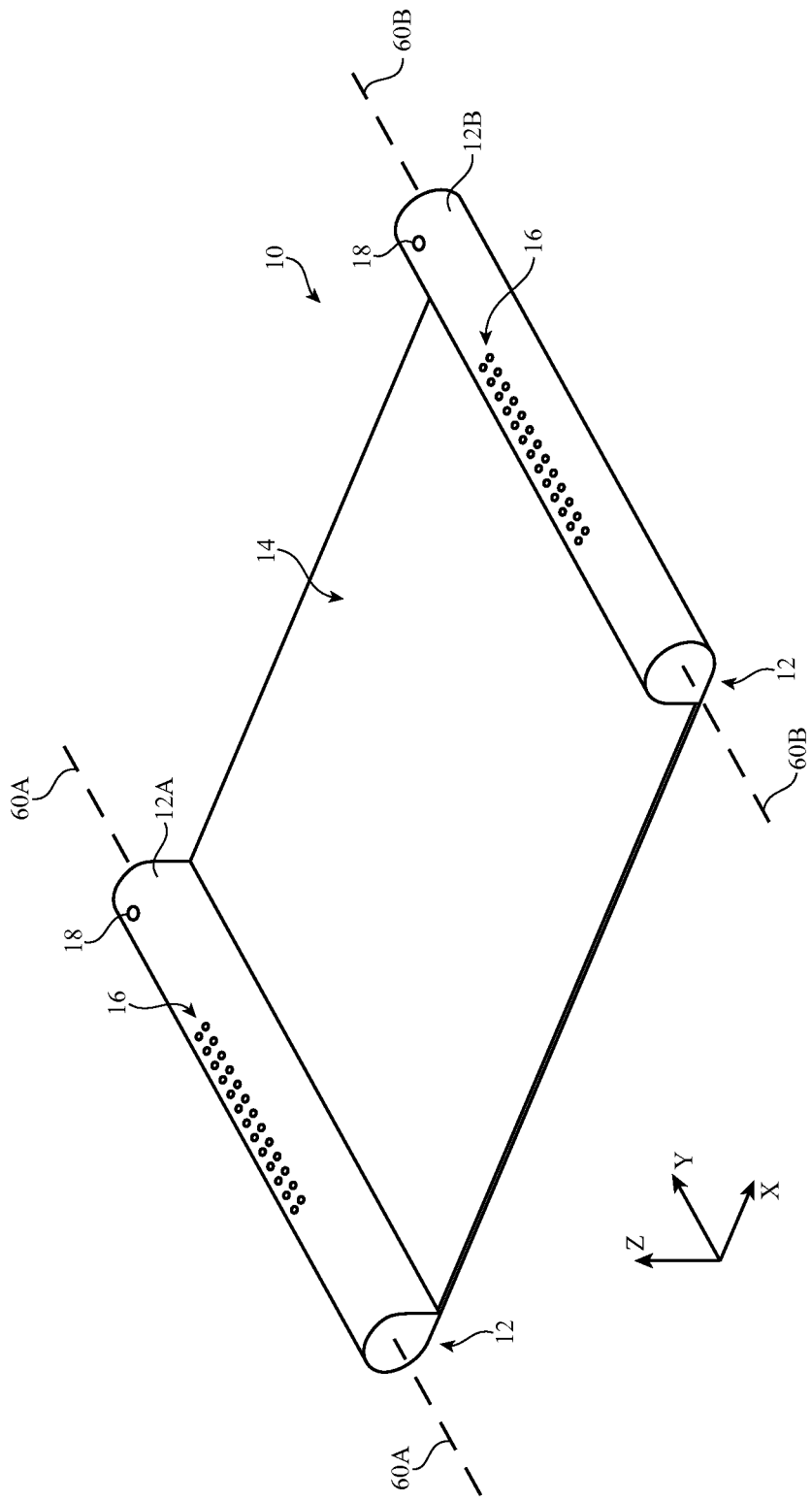
FIG. 1 is a perspective view of an illustrative electronic device having a display in a deployed configuration in accordance with an embodiment.

An illustrative electronic device of the type that may be provided with a retractable flexible display is shown in FIG. 1. Electronic device 10 may be used as a portable monitor (e.g., for displaying content from an associated computer or other electronic equipment), may be a stand-alone computing device (e.g., an electronic device that can display media, handle wireless communications, receive input from a user, etc.), or may be any other electronic device. Device 10 may contain an embedded computer or may have reduced functionality to reduce device cost and complexity.

Device 10 may have a flexible display such as display 14. In the deployed position of FIG. 1, display 14 may have a planar shape (i.e., display 14 may lie in the X-Y plane of FIG. 1). The outline of display 14 may be rectangular or display 14 may have other suitable deployed shapes.

Because display 14 is flexible, display 14 may be retracted into housing 12 of device 10 when it is desired to store display 14.

Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may have elongated left and right portions such as barrel-shaped left-housing 12A and barrel-shaped right housing 12B in the example of FIG. 1. Housings 12A and 12B may be formed using a unibody configuration in which some or all of each of these housing structures is machined or molded as a single structure or may be formed using multiple structures (e.g., an internal frame structure, one or more structures that form exterior housing surfaces, etc.). Housings 12A and 12B may be formed from a stainless steel layer (e.g., a stainless steel shell structure) or may be formed from aluminum, other metals, or other materials.

Electrical components for device 10 may be mounted in housings 12A and 12B. For example, one or more speakers and/or microphones may be mounted in alignment with openings 16 in housings 12A and/or 12B. Openings 16 may be microperforations having diameters of less than 1 mm, less than 0.5 mm, less than 0.1 mm, 0.05 to 4 mm, more than 0.01 mm, or other suitable size. Openings 16 may or other openings in housing 12 may form audio ports to accommodate speakers and microphones.

Optical components in electronic device 10 such as sensors, cameras, light-emitting diodes and other light-based components can be accommodated using optical windows 18. Optical windows 18 may be associated with left and right cameras in left housing 12A and right housing 12B, respectively (e.g., to provide device 10 with the ability to capture stereoscopic images of a user of device 10). Device 10 may also be provided with buttons and other user input devices mounted on housing 12.

Figure 2:
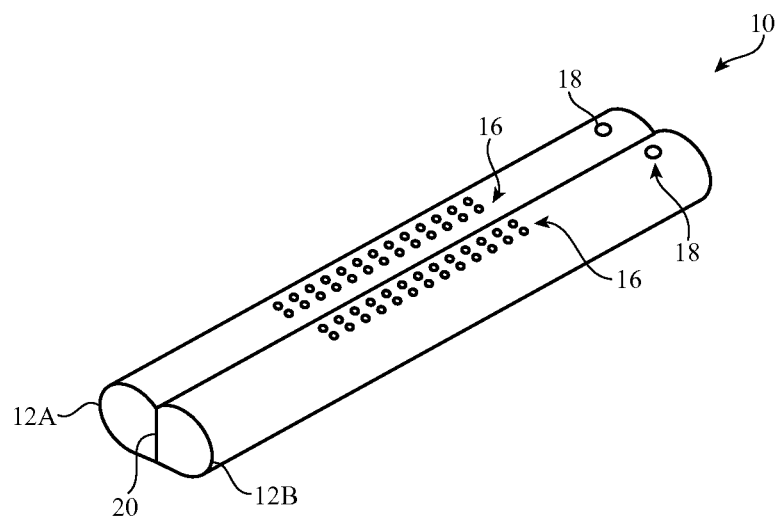
FIG. 2 is a schematic diagram of the illustrative electronic device of FIG. 1 in which the display has been retracted into the housing of the electronic device in accordance with an embodiment.

Housing portions 12A and 12B may have elongated cylindrical (barrel) shapes. As shown in FIG. 1, housing 12A may have an elongated shape that extends along longitudinal axis 60A and housing 12B may have an elongated shape that extends along longitudinal axis 60B. Rollers may be provided in housing portions 12A and/or 12B to receive flexible display 14 when flexible display 14 is retracted. The rollers may rotate about axes 60A and/or 60B when retracing and deploying flexible display 14, so axes 60A and 60B may sometimes be referred to as roller axes or rotational axes. To ensure that display 14 remains in its deployed state, the rollers in housing 12 may be provided with a latching mechanism. When the latching mechanism is released, springs within housing 12 can pull display 14 into housing 12A and/or housing 12B. FIG. 2 shows how device 10 may appear when display 14 has been fully retracted. In the configuration of FIG. 2, housings 12A and 12B may mate along surface 20. Magnets or other structures (e.g., mating engagement structures such as clips and springs, hook and loop fasteners, etc.) may be used to hold housings 12A and 12B together when device 10 has been placed in the retracted display configuration of FIG. 2.

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch sensitive. Capacitive touch screen electrodes may be formed from an array of indium tin oxide pads, a metal mesh of wires that are sufficiently thin to appear transparent, or other transparent conductive structures. A touch sensor may be formed using electrodes or other structures on a display layer that contains a pixel array or on a separate touch panel layer that is attached to the pixel array (e.g., using adhesive).

Display 14 may include pixels formed from liquid crystal display (LCD) components, electrophoretic pixels, micro-electromechanical (MEMs) shutter pixels, electrowetting pixels, micro-light-emitting diodes (small crystalline semiconductor die), organic light-emitting diodes (e.g., a thin-film organic light-emitting diode display), or pixels based on other display technologies. Configurations in which display 14 is an organic light-emitting diode display are sometimes described herein as an example.

Figure 3:
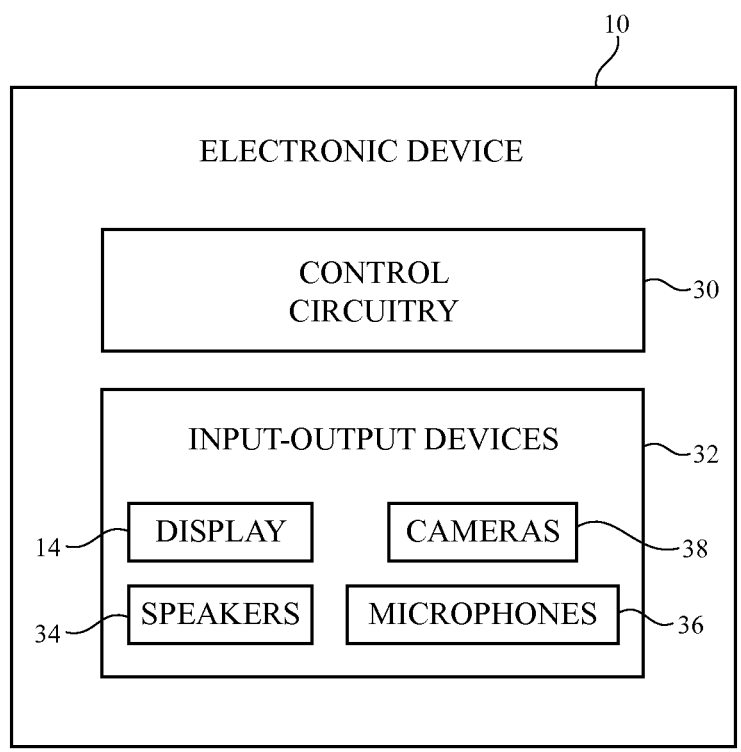
FIG. 3 is a schematic diagram of an illustrative electronic device in accordance with an embodiment.

A schematic diagram of an illustrative electronic device such as device 10 of FIG. 1 is shown in FIG. 3. As shown in FIG. 3, electronic device 10 may have control circuitry 30. Control circuitry 30 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 30 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 32 may be used to allow data to be supplied to device 10 and to allow data to be provided from device 10 to external devices. Input-output devices 32 may include display 14, buttons, joysticks, scrolling wheels, touch pads, key pads, keyboards, microphones 36, speakers 34, tone generators, vibrators, cameras 38, sensors, light-emitting diodes and other status indicators, data ports, etc. A user can control the operation of device 10 by supplying commands through input-output devices 32 and may receive status information and other output from device 10 using the output resources of input-output devices 32.

Control circuitry 30 may be used to run software on device 10 such as operating system code and applications. During operation of device 10, the software running on control circuitry 30 may display images on display 14 (e.g., video, still images such as text, alphanumeric labels, photographs, icons, other graphics, etc.) using an array of pixels in display 14, may gather still and/or moving images using cameras 38, may play audio through speakers 34, may gather audio input using microphones 36, and may control other device operations.

Figure 4:
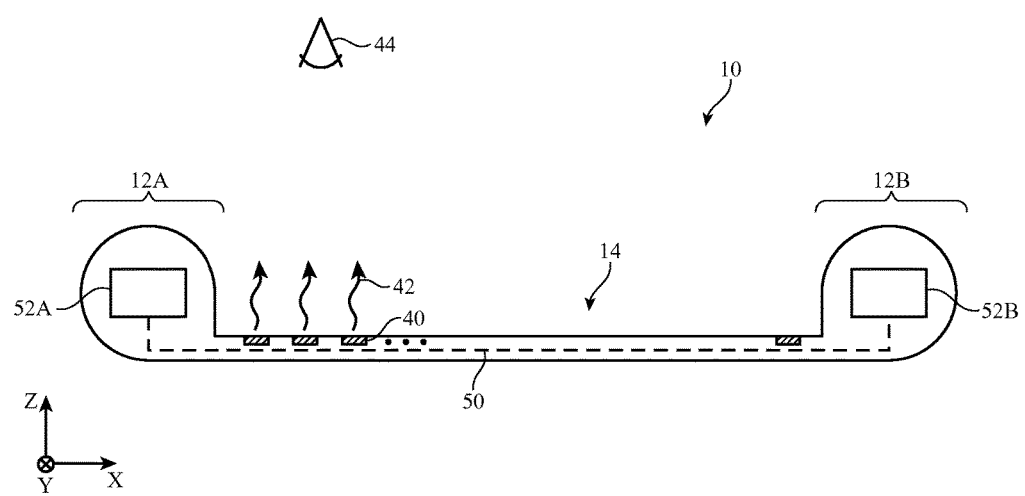
FIG. 4 is a cross-sectional side view of an illustrative electronic device of the type shown in FIG. 1 in accordance with an embodiment.

FIG. 4 is a cross-sectional side view of device 10 showing how electrical components 52A may be mounted in housing 12A and showing how electrical components 52B may be mounted in housing 12B. Components 52A and 52B may include batteries, integrated circuits, sensors, and other components (see, e.g., control circuitry 30 and input-output devices 32 of FIG. 3). Metal traces or other signal lines may be used to form signal paths 50 in display 14. Signal paths 50 may be used to allow electrical components 52A to communicate with electrical components 52B. Signal paths 50 may also be used to route data signals and control signals to an array of organic light-emitting diodes 40 on the upper surface of display 14. Each light-emitting diode 40 may form part of a pixel in an array of pixels in display 14 that is used to display images for a user (see, e.g., viewer 44 of FIG. 4). Light-emitting diodes 40 may emit light 42 of different colors (e.g., red, blue, and green, etc.).

When not in use, display 14 may be stored in housing 12A, in housing 12B, or may be stored using cavities inside both housing 12A and housing 12B.

Figure 5:
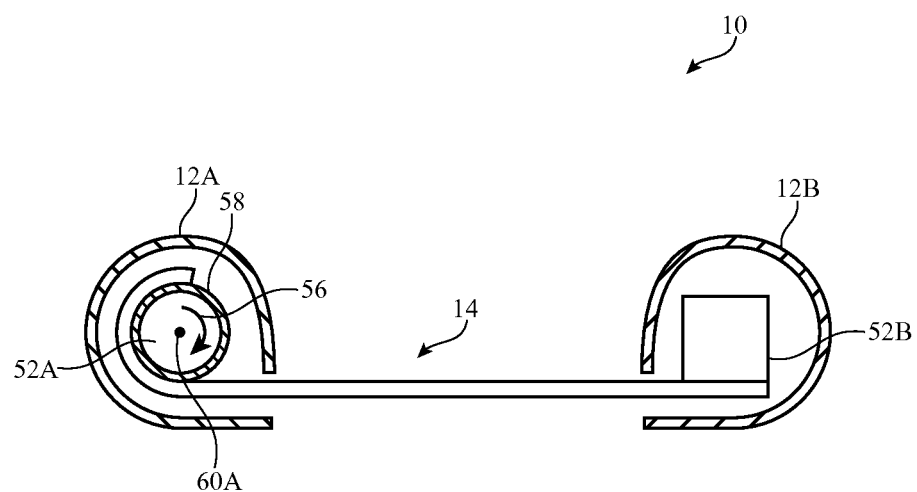
FIG. 5 is a cross-sectional side view of an illustrative electronic device having a left housing portion into which a flexible display may be retracted in accordance with an embodiment.

FIG. 5 is a cross-sectional side view of display 10 in an illustrative configuration in which display 14 is retracted into housing 12A when not in use. As shown in FIG. 5, housing 12A may contain a cylindrical display storage member such as roller 58 (e.g., a cylindrical drum, a hollow elongated member with non-circular profiles, etc.). Roller 58 may be a hollow cylinder that is filled with electrical components 52A. Roller 58 may rotate about axis 60A in direction 56 when it is desired to retract display 14 into housing 12A. With each successive rotation of roller 58, another layer of display 14 may be wrapped around roller 58. A mechanically or electrically actuated latch may retain roller 58 in place until it is desired to deploy display 14.

In the example of FIG. 5, housing 12B does not contain rotating internal structures such as roller 58, but rather contains components 52B that remain stationary with respect to display 14 and housing 12B. Other configurations for device 10 may be used if desired (e.g., configurations in which display 14 is retracted into housing 12B using a rotating drum in housing 12B, etc.).

Figure 6:
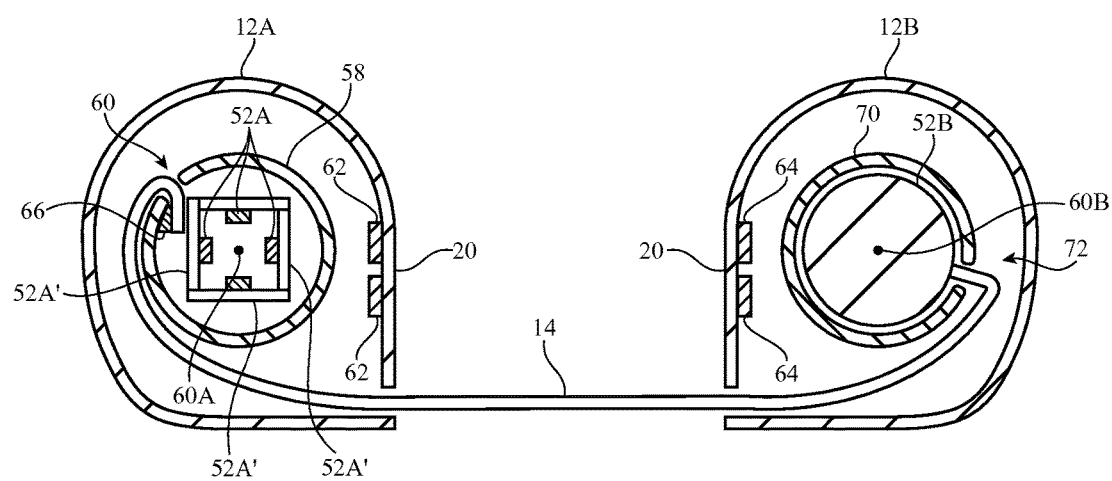
FIG. 6 is a cross-sectional side view of an illustrative electronic device showing how the flexible display may be coupled to circuitry within the device in accordance with an embodiment.

As shown in the illustrative side view of FIG. 6, roller 58 may have an opening such as opening 60 into which the left edge of display 14 may be inserted and held in place using adhesive 66. A clamp may also be used to help secure display 14 within roller 58. The arrangement of FIG. 6 allows signal paths in display 14 to be coupled to signal paths in printed circuits 52A' and thereby be electrically coupled to electrical components 52A on printed circuits 52A'. In the example of FIG. 6, printed circuits 52A' have been mounted to form a four-sided tube in the interior of roller 58. Other arrangements for mounting electrical components 52A and printed circuits 52A' within roller 58 may be used, if desired.

Right housing 12B may contain an elongated hollow structure such as structure 70 with an opening 72 through which the right edge of display 14 may be inserted and attached to electrical components 52B. Structure 70 may be fixed to housing 12B or may be a hollow drum or other structure that rotates about axis 60B with respect to housing 12B. Components 52B may include a battery and other electrical devices.

Housing 12A and 12B may be provided with structures such as magnets 62 on housing 12A and corresponding magnets 64 on housing 12B. Magnets 62 and 64 may be configured to attract each other and thereby pull mating housing surfaces 20 of housings 12A and 12B together when display 14 is retracted. If desired, mechanical engagement structures (e.g., springs and clips, locking mechanisms, and other structures) may be used to supplement magnets 62 and magnets 64 or may be used to hold housings 12A and 12B together in configurations for device 10 without magnets. Configurations in which a set of magnets mates with a corresponding ferromagnetic structure such as an iron bar may also be used.

Figure 7:
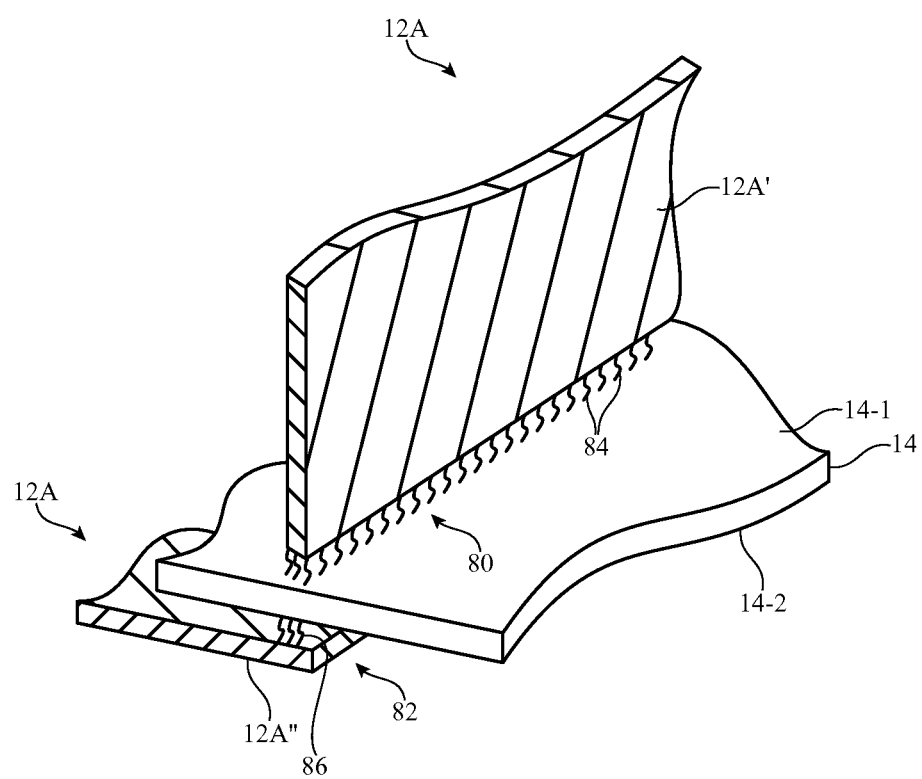
FIG. 7 is a perspective view of an illustrative dust brush for an electronic device with a retractable flexible display in accordance with an embodiment.

During normal use of display 14, contaminants such as dust particles may be deposited on the surface of display 14. To remove these dust particles and thereby prevent damage to display 14 when display 14 is wrapped on top of itself within housing 12, device 10 may be provided with brushes or other dust removal structures. In the example of FIG. 7, device housing 12A has been provided with a portion 12A' that is separated from upper surface 14-1 of display 14 by gap 80 and has a portion 12A" that is separated from lower surface 14-2 of display 14 by gap 82. Gaps 80 and 82 form an opening into which display 14 may pass when moved in and out of housing 12A.

Brushes may be formed from foam, bristles, or other brush structures in gaps 80 and 82, respectively. As shown in FIG. 7, brush bristles 84 may form a brush that spans gap 80 and brush bristles 86 may form a brush that spans gap 82. Bristles 84 and 86 may be formed from plastic or other suitable materials.

Figure 8:
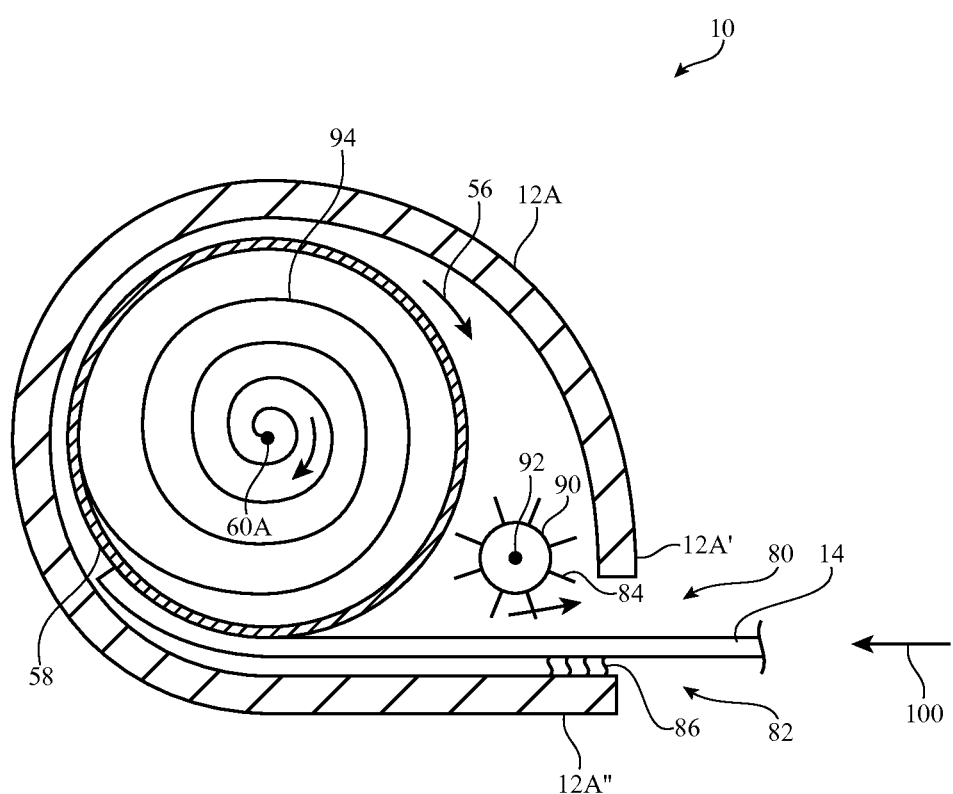
FIG. 8 is a cross-sectional side view of a housing portion with a rotating dust brush for cleaning a retractable flexible display in accordance with an embodiment.

FIG. 8 shows how bristles 84 may be mounted on a rotating support structure such as structure 90 (e.g., a cylindrical member). When structure 90 is rotated about brush rotational axis 92, dust is swept off of upper display surface 14-1 and out of gap 80. If desired, a rotating brush may be formed in housing 12A that cleans the lower surface of display 14. The configuration of FIG. 8 is merely illustrative.

As shown in FIG. 8, device 10 may be provided with springs such as coil spring 94. In the example of FIG. 8, spring 94 has one end attached to roller 58 and another end coupled to housing 12A (e.g., at an attachment point near axis 60A or other suitable mounting point). Spring 94 may be tensioned when display 14 is pulled out of housing 12A to deploy display 14 for viewing by viewer 44 of FIG. 4. When roller 58 is released and allowed to rotate about axis 60A to retract display 14, the tension exerted by spring 94 may help rotate roller 58 in direction 56 and thereby retract display 14 into housing 12A in direction 100. In housing 12A, display 14 wraps around roller 58 and axis 60A. Housing 12B may also have a spring or other biasing member to exert a biasing force on a display storage structure such as a hollow cylindrical roller, if desired.

Figure 9:
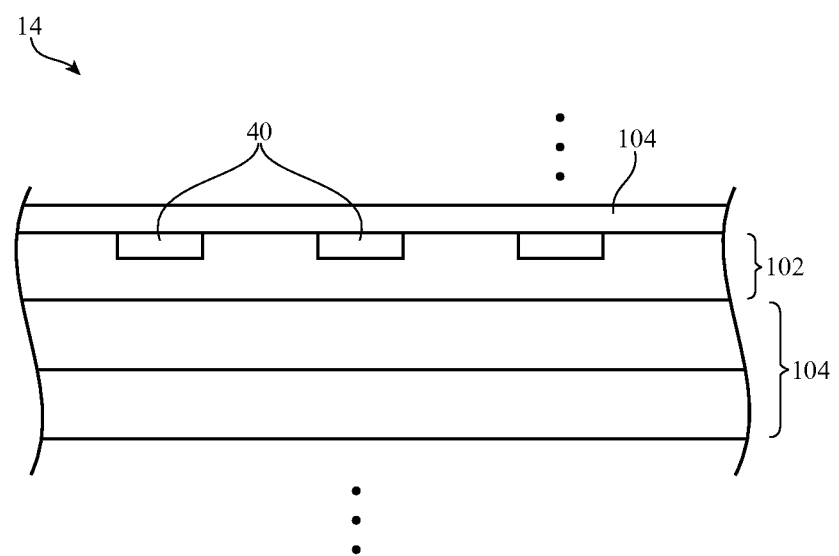
FIG. 9 is a cross-sectional side view of a flexible display in accordance with an embodiment.

As shown in FIG. 9, display 14 may have an organic light-emitting diode display layer such as layer 102. Layer 102 may contain a polymer substrate, thin-film transistor circuitry on the substrate, an array of diode terminals and areas of emissive material to form diodes 40, and an encapsulation layer. Display 14 may also have additional layers above and/or below organic light-emitting diode layer 102 such as layers 104. Layers 104 may include functional layers (e.g., a circular polarizer above layer 102 to suppress reflections, a touch sensor layer on the polarizer, a protective layer above the polarizer layer and touch sensor to prevent damage from scratches, support layers below layer 102, etc.). Layers 104 may include metal (e.g., stainless steel, aluminum, copper, and other metals), may include polymers, may include carbon-fiber composites and other composite materials, may include ceramics, may include glasses, may include crystalline materials such as sapphire, may include fabric formed from plastic, metal, glass, and/or other materials, or may include other materials. The metal in layers 104 may include flexible metal foil (e.g., a thin sheet of stainless steel or other metal).

Figure 10:
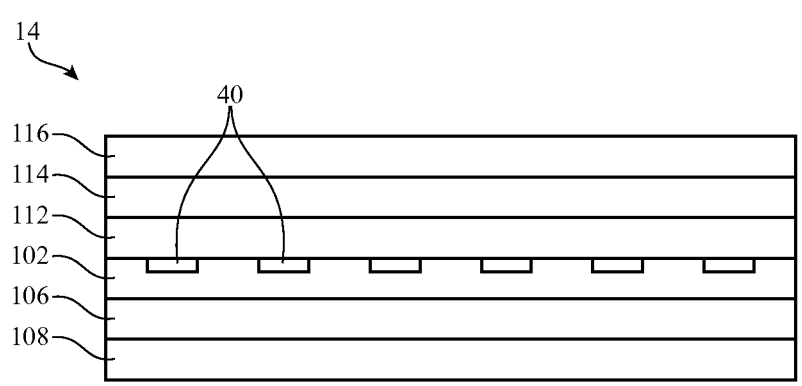
FIG. 10 is a cross-sectional side view of a flexible display showing how the display may be mounted on a support substrate and may be covered with functional and protective layers in accordance with an embodiment.

A cross-sectional side view of display 14 in an illustrative configuration in which organic light-emitting diode layer 102 is attached to additional layers of material is shown in FIG. 10. In the example of FIG. 10, organic light-emitting diode layer 102 includes a polymer substrate, thin-film transistor circuitry on the substrate, emissive material, conductive structures, and encapsulation for forming encapsulated array of light-emitting diodes 40. Organic light-emitting diode layer 102 may be attached to layer 106. Layer 106 may be a polymer layer containing nanoparticles to enhance thermal conductivity. For example, layer 106 may be formed from a polymer such as polyethylene terephthalate (PET).

Layer 106 may be filled with graphite particles to enhance thermal conductivity. In addition to enhancing the thermal conductivity of display 14 and helping to dissipate heat from diodes 40, layer 106 may serve as an opaque layer that blocks stray light (e.g., a black masking layer). Because layer 106 may serve both light block functions and thermal spreading functions, layer 106 may sometimes be referred to as a light blocking and thermal spreading layer.

Layer 106 may be attached to support layers such support layer 108. Support layer 108 may be formed from a thin metal foil such as a foil of stainless steel or copper. Layer 108 may also be a metallic glass or other material that provides mechanical strength and helps the lower surface of display 14 resist scratches when device 10 is placed on a table or other support surface.

Layer 112 may cover organic light-emitting diode layer 102. Layer 112 may include a polarizer layer (e.g., a circular polarizer having a thickness of about 50 microns).

Layer 114 may cover layer 112. Layer 114 may be a touch sensor layer. Touch sensor layer 114 may be formed from a silver mesh, other metal mesh structures, an array of indium tin oxide capacitive electrodes, or other touch sensor structures.

Protective layer 114 may be formed from a layer of polymer or other flexible structures that help display 14 resist damage (e.g., a thin flexible glass layer, etc.).

If desired, additional support structure such as structures for providing display 14 with a rigid rear support when display 14 is deployed may be added to structures to the type shown in FIG. 10. The example of FIG. 10 is merely illustrative.

Figure 11:
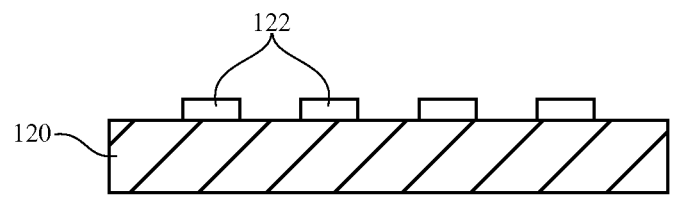
FIGS. 11, 12, and 13 are cross-sectional side views of a display during illustrative operations to provide the display with a grooved flexible support structure in accordance with an embodiment.
Figure 12:
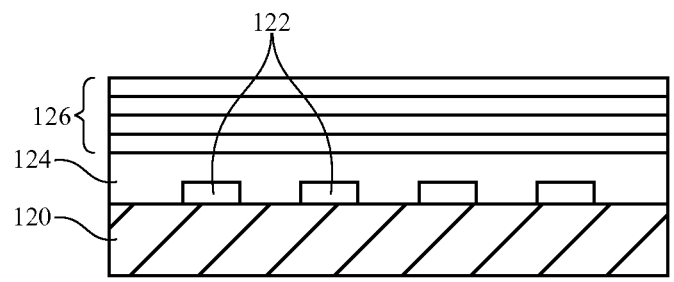
Figure 13:
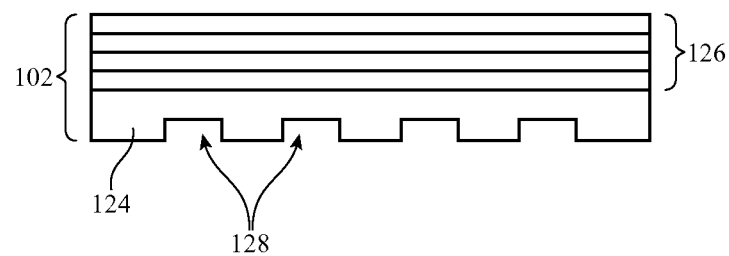

One or more of the layers in display 14 may be provided with corrugations or other grooves to enhance flexibility. FIGS. 11, 12, and 13 show illustrative process steps involved in forming a flexible display of this type. In the example of FIGS. 11, 12, and 13, a flexible polymer substrate for organic light-emitting diode layer 102 is being provided with a series of parallel grooves (grooves that extend parallel to axis 60A and dimension Y in the example of FIG. 1). As shown in FIG. 11, a carrier such as glass carrier 120 may be provided with protrusions 122 (e.g., ridges formed from glass portions of carrier 120, ridges formed from polymer, or ridges formed from other material on the surface of carrier 120).

As shown in FIG. 12, carrier 120 and ridges 122 may be coated with substrate layer material for forming substrate 124. As an example, substrate 124 may be formed from a liquid polymer such as a liquid polyimide precursor that is cured to form a polyimide substrate for organic light-emitting diode layer 102. Thin-film layers 126 may be deposited and patterned on substrate 124. Substrate 124 may then be removed from carrier 120 to form organic light-emitting diode layer 102 of FIG. 13. As shown in FIG. 13, because substrate layer 124 was formed on a carrier with ridges, substrate 124 has a series of parallel flexibility-enhancing grooves 128. Other structures may be used to enhance the flexibility of display 14 if desired. The corrugated shape of FIG. 13 is merely illustrative.

Layers 126 may include a thin-film transistor layer and associated light-emitting diode structures. Layers 126 may also include moisture barrier structures. Layers 126 may include inorganic and organic dielectric layers, semiconductor layers, and metal layers. These layers may form buffer layers, gate insulator layers, semiconductor channel regions in transistors, capacitor plates, metal interconnects, component terminals, interlayer dielectric layers, planarization layers, moisture barrier layers, etc.

Figure 14:
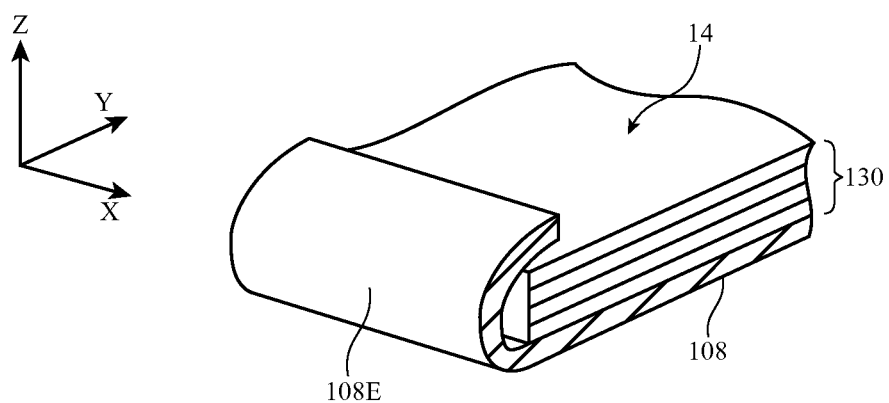
FIG. 14 is a perspective view of a portion of an illustrative display showing how the display may be provided with a protective edge trim in accordance with an embodiment.

One or more edges of display 14 (e.g., the top and bottom edges of display 14 of FIG. 1 that run parallel to lateral dimension X in the example of FIG. 1) may be provided with edge protection structures. Consider, as an example, the arrangement of FIG. 14. As shown in FIG. 14, display 14 has layers 130. Layers 130 may be mounted on support layer 108. Layers 130 may include, for example, a series of layers such as a protection layer, a touch sensor layer, a polarizer layer, an organic light-emitting diode layer, and a light-blocking and thermal spreading layer. Layers 130 may be mounted on layer 108 (e.g., a flexible stainless steel layer or other supporting structure). Edge portion 108E of rear support layer 108 may be bent around the edge of layers 130 and crimped into place as shown in FIG. 14. This allows bent edge portion 108E of layer 108 to provide edge protection to layers 130. If desired, edge portion 108E may be separated from the rest of layer 108, edge portion 108E may be attached to the edge and top surfaces of layers 130 using adhesive, and/or other edge protection structures may be used to protect the exposed edges of display 14. The example of FIG. 14 is merely illustrative.

Figure 15:
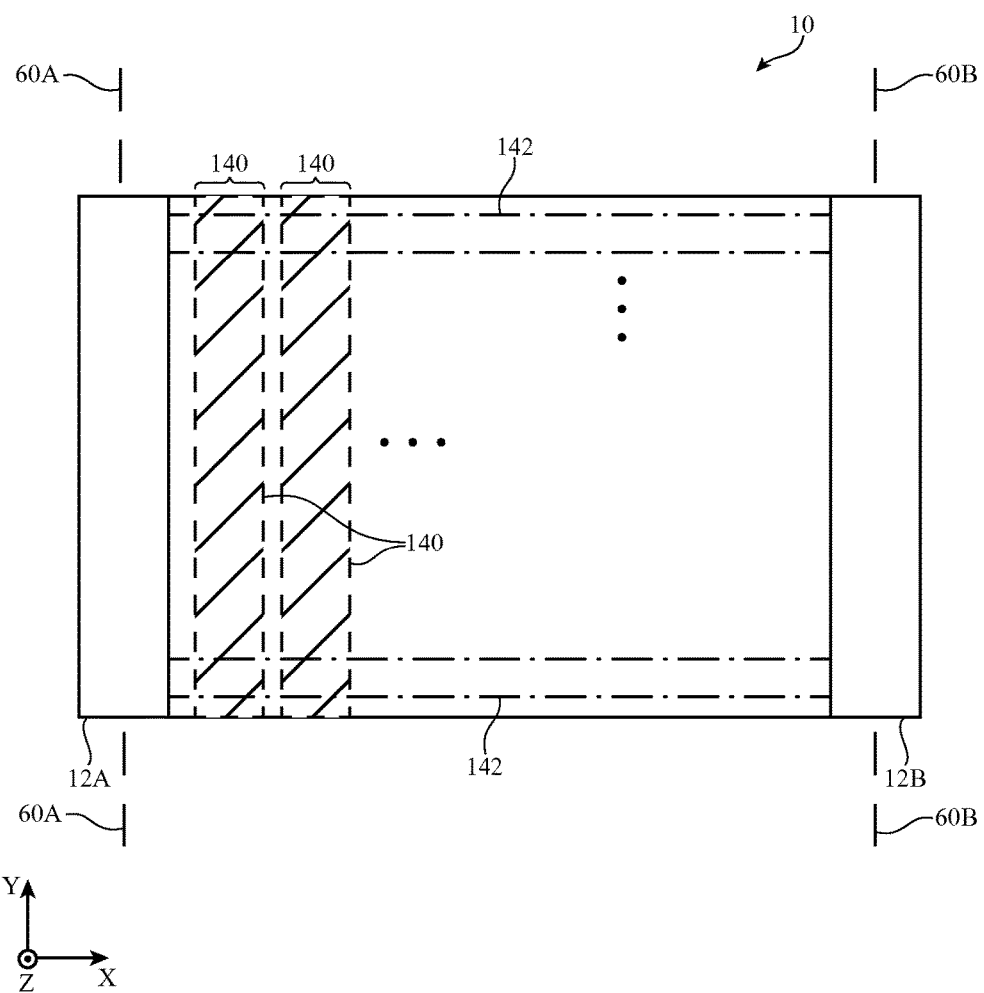
FIG. 15 is a top view of an illustrative electronic device with a flexible retractable display that has been provided with a web of support structures in accordance with an embodiment.

It may be desirable to provide display 14 with a support structure that is rigid when display 14 is deployed and that may be made sufficiently flexible to allow display 14 to be wrapped around rollers in housing 12 when display 14 is stored. This type of structure is shown in the top view of display 14 of FIG. 15. In the example of FIG. 14, display 14 has been provided with two different types of support structures on the rear surface of display 14: supports 140 and supports 142. Supports 140 and 142 may be separate sets of elongated support members (sometimes referred to as slats or strips) or supports 140 and 142 may be formed as parts of an integral web structure. Supports 140 run parallel to the Y dimension of FIG. 15 (i.e., parallel to longitudinal housing axes 60A and 60B). Supports 140 may be rigid along their lengths to help support display 14. Supports 142 run parallel to the X dimension of FIG. 15 (perpendicular to supports 140). Supports 142 may be bistable members that exhibit both rigid and flexible states.

Supports 140 and 142 may be formed from plastic, metal, fiber-composites, and/or other materials. There may be any suitable number of supports 140 in display 14 and any suitable number of supports 142 in display 14 (e.g., 1-100, 5-20, 3-50, etc.). Supports 142 may include a pair of edge supports that run along the exposed edges of display 14 and one or more additional optional central supports that lie between the edge supports. Supports 140 may, as an example, cover all of display 14. Gaps may be formed between respective supports 140 to provide display 14 with flexing regions.

Figure 16:
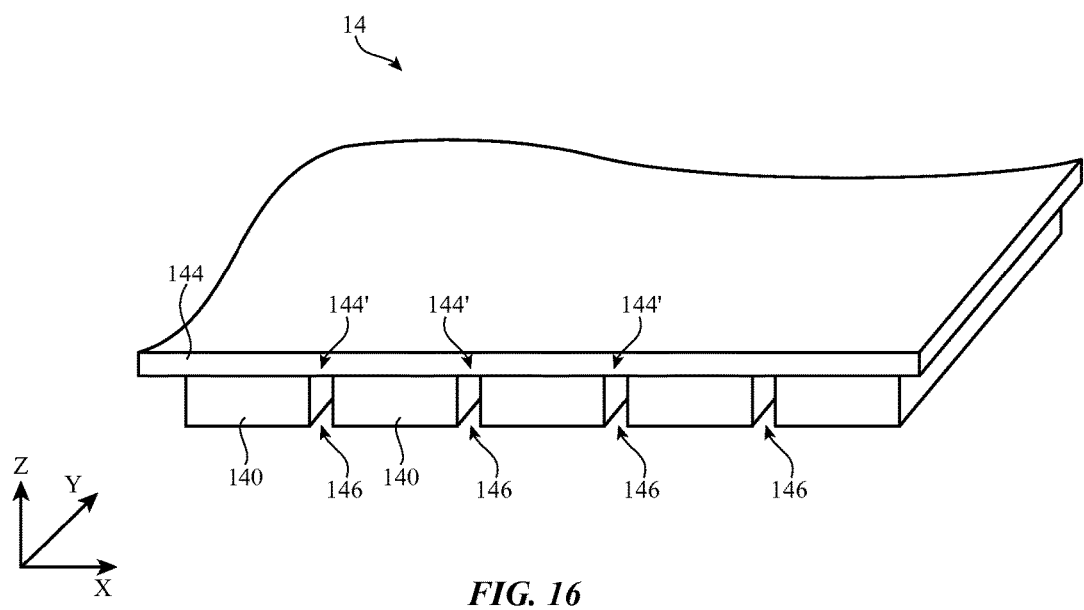
FIG. 16 is a perspective view of an illustrative flexible display with parallel rigid support slats in accordance with an embodiment.
Figure 17:
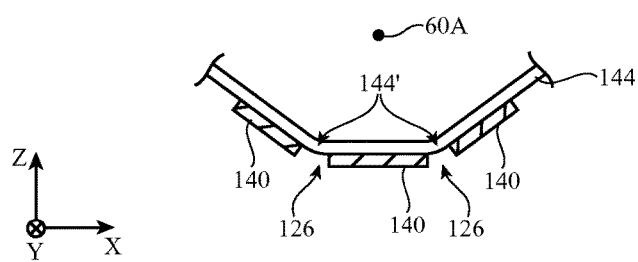
FIG. 17 is a cross-sectional side view of a portion of the flexible display of FIG. 16 showing how flexible portions of the display between the slats allow the display to be rolled into a cylindrical shape in accordance with an embodiment.

As shown in the illustrative perspective view of display 14 of FIG. 16, support structures 140 may be configured to form a series of parallel supports on the lower surface of display layer 144 that are separated by respective gaps 146. In gaps 146, flexible portions of display layer 144 such as flexible portions 144' may allow display 14 to bend about axis 60A (i.e., the Y axis), as shown in FIG. 17. Layer 144 may include organic light-emitting diode layer 102 and one or more other layers (see, e.g., the layers of FIG. 10).

Figure 18:
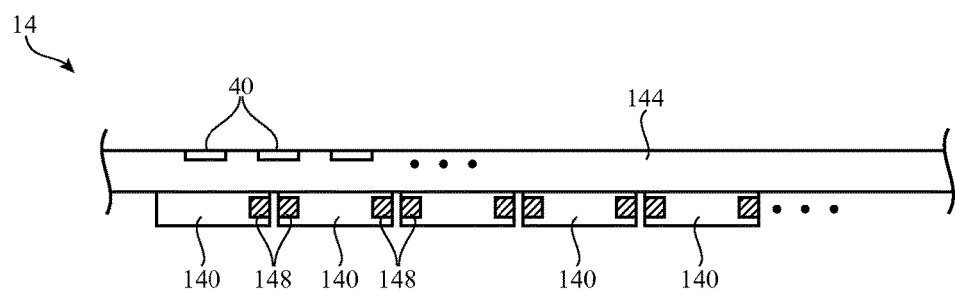
FIG. 18 is a cross-sectional side view of an illustrative flexible display with support slats that have magnets in accordance with an embodiment.

FIG. 18 is a cross-sectional side view of a flexible display with support slats 140 in a planar configuration (i.e., when display 14 is deployed). Magnets 148 may be provided in slats 140 or on slats 140 to hold slats 140 against each other and thereby maintain display 14 in a rigid planar configuration when in a deployed position (e.g., so that a user can supply touch input to the touch sensor of layer 14).

Figure 19:
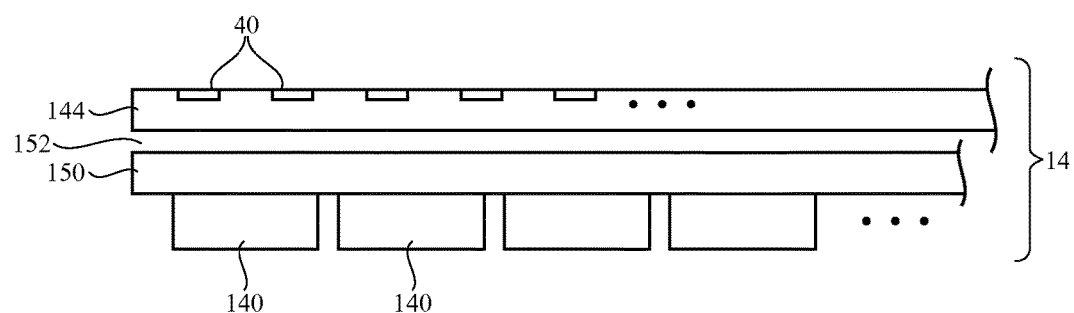
FIG. 19 is a cross-sectional side view of an illustrative flexible display in which support slat members have been mounted to a flexible substrate that can be separated from a flexible organic light-emitting diode substrate by an air gap in accordance with an embodiment.

FIG. 19 is a cross-sectional side view of display 14 showing how the support structures on the rear of display 14 may be implemented by mounting support slats 140 on a flexible layer such as layer 150 (e.g., a flexible polymer layer) that is separate from layer 144. As shown in FIG. 19, layer 144 and flexible layer 150 may be separated by an air gap such as gap 152. The presence of gap 152 allows layers 150 and 144 to slide laterally with respect to each other as display 14 is deployed and retracted, thereby helping to avoid an undesirable build up of stress in display 14.

Figure 20:
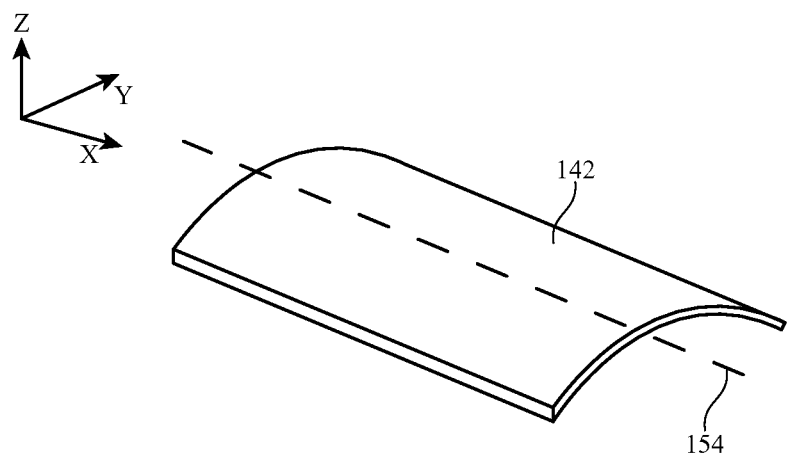
FIG. 20 is a perspective view of an illustrative elongated support member formed from a bistable metal strip in accordance with an embodiment.
Figure 21:
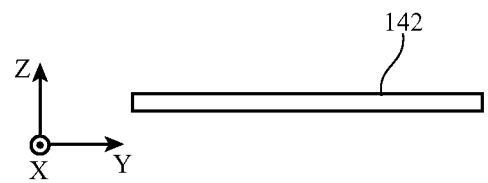
FIG. 21 is a cross-sectional side view of the support member of FIG. 20 in its flat flexible state in accordance with an embodiment.

FIG. 20 is a perspective view of an illustrative bistable structure that may be used in implementing elongated support members such as support slats 142. As shown in FIG. 20, support slats 142 may have elongated rectangular strip shapes or other shapes. Each slat 142 may extend along a longitudinal axis 154 parallel to axis X in the example of FIG. 15. Slats 142 may have a curved shape (i.e., a curved profile) that provides slats 142 with bistability. Slats 142 may be formed from plastic, metal (e.g., spring metal, etc.), or other suitable materials. When allowed to relax, slats 142 assume their bowed (curved) shape and assume a rigid state to form rigid supports on the rear surface of display 14. Because slats 142 run perpendicular to slats 140, slats 142 (in their relaxed bowed state) will resist bending about axes 60A and 60B (i.e., the Y axis of FIG. 20) and will therefore help to maintain display 14 in a planar rigid state. When forced into their flat state by applying sufficient bending force (FIG. 21), slats 142 will snap into their flat (flexible) state and will no longer significantly resist bending about axis Y. When in their flexible flat state, slats 142 can be wrapped around drum 58 as display 14 is retracted into housing 12. If desired, other bistable support structures may be used to provide display 14 with the ability to transition between rigid and flexible states. The illustrative bistable metal strip configuration of slat 142 of FIGS. 20 and 21 is merely illustrative.

The foregoing is merely illustrative and various modifications can be made by those skilled in the art without departing from the scope and spirit of the described embodiments. The foregoing embodiments may be implemented individually or in any combination.

What is claimed is:

1. An electronic device comprising: a housing having first and second housing portions; a rotating roller within the first housing portion; a flexible display that is attached to the second housing portion and that is attached to the rotating roller so that the flexible display is retracted within the first housing portion by rotation of the rotating roller, wherein the flexible display comprises a substrate having first and second opposing surfaces with a pixel array on the first surface and flexibility-enhancing grooves in the second surface, and wherein the flexibility-enhancing grooves are located behind the pixel array such that light from the pixel array is directed away from the flexibility-enhancing grooves; support members that are perpendicular to the first and second housing portions and that extend entirely behind the flexible display, wherein the support members are bistable members that exhibit a rigid state and a flexible state, and wherein the support members wrap around the rotating roller with the flexible display when the flexible display is retracted within the first housing portion; and additional support structures that are parallel to the first and second housing portions.

2. The electronic device defined in claim 1 further comprising:
printed circuits in the rotating roller that rotate with the rotating roller.

3. The electronic device defined in claim 2 wherein the rotating roller has an opening through which an edge of the flexible display passes to couple the edge of the flexible display to at least one of the printed circuits.

4. The electronic device defined in claim 3 further comprising a battery in the second housing portion.

5. The electronic device defined in claim 3 further comprising a first camera in the first housing portion and a second camera in the second housing portion.

6. The electronic device defined in claim 3 further comprising a spring in the first housing portion that is coupled between the first housing portion and the rotating roller to rotate the rotating roller and retract the flexible display into the first housing portion.

7. The electronic device defined in claim 6 further comprising a brush in the first housing portion that removes dust from the flexible display.

8. The electronic device defined in claim 7 wherein the brush comprises a rotating brush.

9. The electronic device defined in claim 3 further comprising a first speaker in the first housing portion and a second speaker in the second housing portion.

10. The electronic device defined in claim 1 wherein the flexible display comprises an organic light-emitting diode display layer.

11. The electronic device defined in claim 10 wherein the flexible display comprises a touch sensor.

12. The electronic device defined in claim 11 further comprising a light-blocking and thermal spreading layer to which the organic light-emitting diode display layer is attached.

13. The electronic device defined in claim 12 wherein the light-blocking and thermal spreading layer comprises a polymer layer that contains graphite.

14. The electronic device defined in claim 13 further comprising a metal foil layer to which the organic light-emitting diode display is attached.

15. The electronic device defined in claim 14 wherein the metal foil layer has an edge portion that covers and protects an edge of organic light-emitting diode display layer.

16. The electronic device defined in claim 1 wherein the additional support structures are separated by gaps and the flexible display bends at the gaps when the flexible display is retracted within the first housing portion.

17. The electronic device defined in claim 1 further comprising an additional rotating roller within the second housing portion.

18. A flexible display, comprising:
a flexible organic light-emitting diode layer that has an array of organic light-emitting diodes and that is operable in a retracted position in which the flexible organic light-emitting diode layer is wrapped around an axis and a deployed position in which the flexible organic light-emitting diode layer is planar;
first elongated support members that run parallel to the axis; and
second elongated support members that run perpendicular to the first elongated support members and that are located entirely behind the flexible organic light-emitting diode layer when the flexible organic light-emitting diode layer is in the deployed position, wherein the second elongated support members are bistable members that exhibit a rigid state and a flexible state, wherein the first and second elongated support members maintain the flexible organic light-emitting diode layer in a rigid planar configuration when the flexible organic light-emitting diode layer is in the deployed position and when the second elongated support members are in the rigid state and wherein the second elongated support members wrap around the axis with the flexible organic light-emitting diode layer when the organic light-emitting diode layer is in the retracted position.

19. The flexible display defined in claim 18 wherein the second elongated support members comprise metal slats that have a curved profile in the rigid state and a flat profile in the flexible state.

20. An electronic device, comprising: a first elongated housing that extends along a first longitudinal axis; a second elongated housing that extends along a second longitudinal axis parallel to the first longitudinal axis; a flexible display having a first state in which the flexible display is retracted within the first elongated housing and a second state in which the flexible display is deployed and extends between the first and second elongated housings for viewing by a user; bistable metal slats that extend between the first and second elongated housing and that are located entirely behind the flexible display, and that hold the flexible display in a rigid state when the flexible display is deployed in the second state, wherein the flexible display completely overlaps the bistable metal slats when the flexible display is in the second state, and wherein the bistable metal slats are retracted within the first elongated housing when the flexible display is in the first state; and additional support structures that are parallel to the first and second elongated housings.

21. The electronic device defined in claim 20 further comprising a hollow drum in the first elongated housing, wherein the flexible display wraps around the hollow drum when the flexible display is retracted within the first elongated housing.

22. The electronic device defined in claim 21 further comprising:
   printed circuits in an interior portion of the hollow drum; and
   integrated circuits mounted on the printed circuits.

23. An electronic device, comprising:
   a first elongated housing that extends along a first longitudinal axis;
   a second elongated housing that extends along a second longitudinal axis parallel to the first longitudinal axis;
   a flexible display having a first state in which the flexible display is retracted within the first elongated housing and a second state in which the flexible display is deployed and extends between the first and second elongated housings for viewing by a user;
   first support members that extend parallel to the first and second elongated housings, wherein the first support members support the flexible display when the flexible display is in the second state, wherein the first support members are separated from one another by gaps, and wherein the flexible display flexes at the gaps when the flexible display is in the first state;
   second support members that extend perpendicular to the first and second elongated housings, wherein the second support members support the flexible display when the flexible display is in the second state; and
   speakers in the first and second elongated housings.

24. The electronic device defined in claim 23, wherein the flexible display comprises an organic light-emitting diode display mounted to a metal sheet.

25. The electronic device defined in claim 24 wherein the organic light-emitting diode display comprises a polymer substrate having grooves that extend parallel to the first longitudinal axis.

26. The electronic device defined in claim 23 wherein the first and second elongated housings comprise metal housings and wherein the electronic device further comprises at least one dust brush in the first elongated housing.

27. The electronic device defined in claim 23 further comprising magnets that hold the first and second housings together when the flexible display is in the first state.

28. The electronic device defined in claim 23 wherein the first support members comprise slats with magnets.

* * * * *